United States Patent
Sagiya (10) Patent No.: US 10,115,704 B2
(45) Date of Patent: Oct. 30, 2018

(54) SEMICONDUCTOR DEVICE

(71) Applicant: TOSHIBA MEMORY CORPORATION, Tokyo (JP)

(72) Inventor: Jun Sagiya, Mie Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 250 days.

(21) Appl. No.: 15/061,962

(22) Filed: Mar. 4, 2016

(65) Prior Publication Data
US 2016/0293582 A1    Oct. 6, 2016

(30) Foreign Application Priority Data
Mar. 30, 2015 (JP) .................... 2015-070401

(51) Int. Cl.
*H01L 29/49* (2006.01)
*H01L 25/065* (2006.01)
(Continued)

(52) U.S. Cl.
CPC ...... *H01L 25/0657* (2013.01); *H01L 23/5389* (2013.01); *H01L 24/19* (2013.01);
(Continued)

(58) Field of Classification Search
CPC . H01L 25/5389; H01L 23/5389; H01L 24/19; H01L 24/20
See application file for complete search history.

(56) References Cited

U.S. PATENT DOCUMENTS 7,193,301 B2    3/2007  Yamaguchi
7,879,714 B2    2/2011  Watanabe
(Continued)

FOREIGN PATENT DOCUMENTS

JP    2005166692 A    6/2005
JP    2009200361 A    9/2009
(Continued)

OTHER PUBLICATIONS

Taiwanese Office Action dated Mar. 10, 2017 in related Taiwanese Patent Application No. 105100073 with English Translation (17 pages).
(Continued)

*Primary Examiner* — Michael Shingleton
(74) *Attorney, Agent, or Firm* — Patterson & Sheridan, LLP (57) ABSTRACT

A semiconductor device includes a first semiconductor chip having a first surface, a second surface on a side of the first semiconductor chip opposite to that of the first surface, a first electrode on the first surface, a second electrode on the second surface, and a first contact electrically connecting the first electrode and the second electrode, and a second semiconductor chip having a third surface facing the first surface, a fourth surface on a side of the second semiconductor chip opposite to that of the third surface and a third electrode on the fourth surface. The semiconductor device further includes a metal wire electrically connecting the first and third electrodes, a first insulating layer on the second surface, a first conductive layer that is on the first insulating layer and electrically connected to the second electrode, and a first external terminal electrically connected to the first conductive layer.

20 Claims, 6 Drawing Sheets

(51) Int. Cl.
  *H01L 25/00* (2006.01)
  *H01L 23/538* (2006.01)
  *H01L 23/00* (2006.01)
  *H01L 21/56* (2006.01)
  *H01L 23/31* (2006.01)

(52) U.S. Cl.
  CPC .............. *H01L 24/20* (2013.01); *H01L 24/96* (2013.01); *H01L 24/97* (2013.01); *H01L 25/50* (2013.01); *H01L 21/568* (2013.01); *H01L 23/3128* (2013.01); *H01L 2224/04042* (2013.01); *H01L 2224/04105* (2013.01); *H01L 2224/12105* (2013.01); *H01L 2224/19* (2013.01); *H01L 2224/32145* (2013.01); *H01L 2224/45144* (2013.01); *H01L 2224/48091* (2013.01); *H01L 2224/48145* (2013.01); *H01L 2224/73265* (2013.01); *H01L 2224/73267* (2013.01); *H01L 2224/73277* (2013.01); *H01L 2224/85005* (2013.01); *H01L 2224/92244* (2013.01); *H01L 2224/92247* (2013.01); *H01L 2224/97* (2013.01); *H01L 2225/0652* (2013.01); *H01L 2225/06506* (2013.01); *H01L 2225/06541* (2013.01); *H01L 2225/06548* (2013.01); *H01L 2225/06562* (2013.01); *H01L 2225/06565* (2013.01)

(56) References Cited

U.S. PATENT DOCUMENTS

| | | | |
|---|---|---|---|
| 8,659,137 B2 | 2/2014 | Omizo et al. | |
| 2005/0194674 A1* | 9/2005 | Thomas | H01L 25/0657 257/690 |
| 2007/0045876 A1* | 3/2007 | Onodera | H01L 21/568 257/790 |
| 2007/0158820 A1* | 7/2007 | Pendse | H01L 21/563 257/700 |
| 2008/0006948 A1* | 1/2008 | Wu | H01L 25/0657 257/778 |
| 2008/0042265 A1* | 2/2008 | Merilo | H01L 25/162 257/723 |
| 2009/0302483 A1* | 12/2009 | Lin | H01L 23/49575 257/777 |
| 2009/0321952 A1* | 12/2009 | Liang | H01L 24/48 257/777 |
| 2010/0033941 A1* | 2/2010 | Pagaila | H01L 23/3128 361/809 |
| 2010/0123251 A1* | 5/2010 | Chow | H01L 23/3135 257/773 |
| 2010/0140752 A1 | 6/2010 | Marimuthu et al. | |
| 2010/0327439 A1* | 12/2010 | Hwang | H01L 23/481 257/737 |
| 2011/0084365 A1* | 4/2011 | Law | H01L 24/05 257/621 |
| 2012/0068338 A1* | 3/2012 | Haba | H01L 23/3128 257/738 |
| 2012/0119387 A1* | 5/2012 | Katagiri | G11C 5/06 257/777 |
| 2012/0313228 A1* | 12/2012 | Haba | H01L 23/3128 257/668 |
| 2013/0114323 A1 | 5/2013 | Shindo et al. | |
| 2014/0048952 A1 | 2/2014 | Lee et al. | |
| 2014/0091471 A1* | 4/2014 | Chen | H01L 24/19 257/770 |
| 2014/0124937 A1* | 5/2014 | Wu | H01L 23/31 257/772 |
| 2014/0252646 A1* | 9/2014 | Hung | H01L 23/481 257/774 |
| 2015/0221614 A1* | 8/2015 | Sutardja | H01L 25/0657 257/675 |
| 2016/0071810 A1* | 3/2016 | Park | H01L 23/58 257/723 |
| 2016/0148857 A1* | 5/2016 | Lin | H01L 25/105 257/762 |
| 2016/0260694 A1* | 9/2016 | Chen | H01L 25/0657 |
| 2016/0293575 A1* | 10/2016 | Liu | H01L 25/0652 |
| 2016/0336303 A1* | 11/2016 | Tsai | H01L 21/4832 |
| 2016/0365324 A1* | 12/2016 | Kim | H01L 21/486 |
| 2017/0092581 A1* | 3/2017 | Chiu | H01L 21/565 |
| 2017/0141080 A1* | 5/2017 | Chen | H01L 25/0657 |
| 2017/0243858 A1* | 8/2017 | Chou | H01L 25/0657 |
| 2017/0263570 A1* | 9/2017 | Lin | H01L 23/49838 |
| 2017/0294410 A1* | 10/2017 | Haba | H01L 25/0657 |
| 2017/0309597 A1* | 10/2017 | Chuang | H01L 25/0657 |
| 2017/0338204 A1* | 11/2017 | Lee | H01L 25/0657 |

FOREIGN PATENT DOCUMENTS

| | | |
|---|---|---|
| JP | 2012023409 A | 2/2012 |
| JP | 2012186295 A | 9/2012 |
| JP | 2013055082 A | 3/2013 |
| JP | 2013175585 A | 9/2013 |
| JP | 2013201218 A | 10/2013 |
| JP | 2015056458 A | 3/2015 |
| TW | 200901427 A | 1/2009 |
| TW | 200915533 A | 4/2009 |
| TW | 201123320 A | 7/2011 |
| TW | 201347138 A | 11/2013 |
| TW | 201436145 A | 9/2014 |

OTHER PUBLICATIONS

Taiwan Office Action dated Jul. 10, 2017, filed in Taiwan counterpart Application No. 105100073, 7 pages (with translation).
Japanese Office Action dated Dec. 15, 2017, flied in Japanese counterpart Application No. 2015-070401, 9 pages (with translation).

* cited by examiner

SEMICONDUCTOR DEVICE

CROSS-REFERENCE TO RELATED APPLICATION

This application is based upon and claims the benefit of priority from Japanese Patent Application No. 2015-070401, filed Mar. 30, 2015, the entire contents of which are incorporated herein by reference.

FIELD

Embodiments described herein relate generally to semiconductor devices.

BACKGROUND

Integrating a plurality of semiconductor chips in one semiconductor device is a known technique.

DETAILED DESCRIPTION

Embodiments provide techniques to reduce an area of a semiconductor device.

In general, according to one embodiment, a semiconductor device includes a first semiconductor chip having a first surface, a second surface on a side of the first semiconductor chip opposite to that of the first surface, a first electrode on the first surface, a second electrode on the second surface, and a first contact electrically connecting the first electrode and the second electrode, and a second semiconductor chip having a third surface that faces the first surface, a fourth surface on a side of the second semiconductor chip opposite to that of the third surface, and a third electrode on the fourth surface. The semiconductor device further includes a metal wire that electrically connects the third electrode to the first electrode, a first insulating layer that is on the second surface of the first semiconductor chip and includes a first opening, a first conductive layer that is in the first opening and on a part of the first insulating layer and is electrically connected to the second electrode, and a first terminal that is electrically connected to the first conductive layer.

Hereinafter, the embodiment will be described with reference to the drawings. In the following description, substantially the same functions and component elements will be identified with the same characters.

First Embodiment

Figure 1:
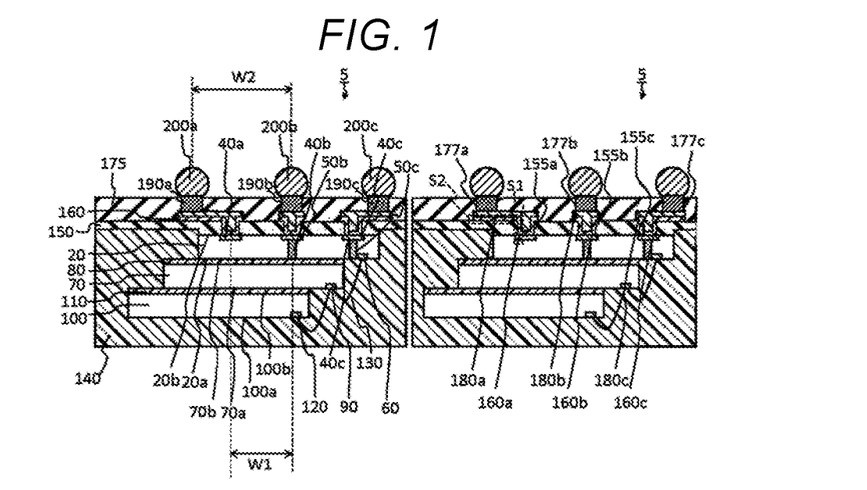
FIG. 1 is a cross sectional view of a semiconductor device according to a first embodiment.

With reference to FIG. 1, a semiconductor device 5 according to a first embodiment will be described.

FIG. 1 is a cross sectional view depicting a wafer after dicing. Here, two separated first semiconductor devices 5 are depicted. However, to simplify the drawings, the component elements of the semiconductor devices are identified with the reference numbers for only one of the semiconductor devices.

The semiconductor device 5 includes a first semiconductor chip 20, a second semiconductor chip 70, and a third semiconductor chip 100. The first semiconductor chip 20, the second semiconductor chip 70, and the third semiconductor chip 100 are arranged in a stair-shaped pattern. Around the first semiconductor chip 20, the second semiconductor chip 70, and the third semiconductor chip 100, a resin layer 140 is arranged. The first semiconductor chip 20, the second semiconductor chip 70, and the third semiconductor chip 100 are, for example, semiconductor memory devices, specifically, NAND memories. Alternatively, one of the first semiconductor chip 20, the second semiconductor chip 70, and the third semiconductor chip 100 may be a controller of the semiconductor memory devices.

Between the first semiconductor chip 20 and the second semiconductor chip 70, a second adhesive material layer 80 is provided. Between the second semiconductor chip 70 and the third semiconductor chip 100, a third adhesive material layer 110 is provided. The second adhesive material layer 80 and the third adhesive material layer 110 bond the upper and lower semiconductor chips together.

The first semiconductor chip 20, the second semiconductor chip 70, and the third semiconductor chip 100 include a first electrode pad 60, a second electrode pad 90, and a third electrode pad 120, respectively. Hereinafter, when there is no need to distinguish the first semiconductor chip 20, the second semiconductor chip 70, and the third semiconductor chip 100 from one another, the first semiconductor chip 20, the second semiconductor chip 70, and the third semiconductor chip 100 are referred to simply as the semiconductor chips. Moreover, when there is no need to distinguish the first electrode pad 60, the second electrode pad 90, and the third electrode pad 120 from one another, the first electrode pad 60, the second electrode pad 90, and the third electrode pad 120 are referred to simply as the electrode pads.

A metal wire 130 electrically connects the first electrode pad 60, the second electrode pad 90, and the third electrode pad 120. The metal wire 130 is, for example, a metal wire such as an Au wire or a Cu wire. Incidentally, the metal wire 130 may be electrically connected to electrode pads of arbitrary semiconductor chips. For example, the metal wire 130 may connect the first electrode pad 60 and the second electrode pad 90 or the first electrode pad 60 and the third electrode pad 120. Moreover, when the semiconductor chips have a plurality of electrode pads and a plurality of metal wires 130, each metal wire 130 may be electrically connected to arbitrary semiconductor chips.

The first semiconductor chip 20 has a first face 20*a* and a second face 20*b*. Moreover, the first semiconductor chip 20 has first conductive contacts 50*b* and 50*c*.

The first face 20*a* includes the first electrode pad 60. A circuit element such as a transistor, wiring, a contact, and an electrode is arranged near the first face 20*a*. The second face 20*b* is a face on the side opposite to the first face 20*a* of the first semiconductor chip 20 and has first electrodes 40*a*, 40*b*, and 40*c*.

The first electrode pad 60 is electrically connected to the metal wire 130 and the first conductive contact 50*c*. Incidentally, the first electrode pad 60 may be electrically connected to the circuit element such as a transistor, the wiring, the contact, and the electrode arranged near the first face 20*a*.

The first electrodes 40a, 40b, and 40c are electrodes provided on the second face 20b. The first electrodes 40a, 40b, and 40c respectively include a conductive layer and are formed by, for example, laser processing and sputtering. Incidentally, when there is no need to distinguish the first electrodes 40a, 40b, and 40c from one another, the first electrodes 40a, 40b, and 40c are referred to as the first electrodes 40.

The first electrode 40a is electrically connected to a first conductive layer 160a.

The first electrode 40b is electrically connected to the first conductive contact 50b and a first conductive layer 160b. That is, the first electrode 40b is electrically connected to the circuit element such as a transistor, the wiring, the contact, and the electrode which are arranged near the first face 20a via the first conductive contact 50b.

The first electrode 40c is electrically connected to the first conductive contact 50c and a first conductive layer 160c. That is, the first electrode 40c is electrically connected to the second semiconductor chip 70 and the third semiconductor chip 100 via the first conductive contact 50c and the metal wire 130.

The first conductive contacts 50b and 50c are contacts including a conductive layer. The first conductive contacts 50b and 50c are contacts containing copper or nickel, for example. The first conductive contact 50b is electrically connected to the circuit element such as a transistor, the wiring, the contact, and the electrode which are arranged near the first face 20a with the first electrode 40b. The first conductive contact 50c is electrically connected to the first electrode pad 60 and the first electrode 40c. Incidentally, when there is no need to distinguish the first conductive contacts 50b and 50c from each other, the first conductive contacts 50b and 50c are referred to as the first conductive contacts 50.

The first conductive contacts 50 are arranged to penetrate the first semiconductor chip 20. Alternatively, the first conductive contacts 50 may be electrically connected to the electrodes (e.g., the first electrodes 40, the first electrode pad 60, and other electrodes) which are arranged near the first face 20a or the second face 20b without penetrating a part of the first semiconductor chip 20.

The second semiconductor chip 70 and the third semiconductor chip 100 may be any semiconductor chip and may be semiconductor chips having the same structure as the first semiconductor chip 20. The second semiconductor chip 70 has a third face 70a and a fourth face 70b, and the third semiconductor chip 100 has a fifth face 100a and a sixth face 100b. Each of the third face 70a and the fifth face 100a is a face near which a circuit element such as a transistor, wiring, a contact are arranged. The third face 70a and the fifth face 100a are arranged on the lower side of FIG. 1. On the third face 70a, the second electrode pad 90 is provided, and on the fifth face 100a, the third electrode pad 120 is provided.

The first insulating layer 150 is arranged on the second face 20b of the first semiconductor chip 20 and on the resin layer 140. The first insulating layer 150 is, for example, a polyimide. The resin layer 140 is in contact with the lower and some side faces of the first insulating layer 150. When viewed from above, in a region in which the first insulating layer 150 overlaps with the first semiconductor chip 20, the first insulating layer 150 is sometimes arranged to be lower than in other regions. Therefore, the first insulating layer 150 in a region in which the first insulating layer 150 overlaps with the first semiconductor chip 20 is in contact with the resin layer 140 at the side face of the first insulating layer 150. As a result of the first insulating layer 150 being in contact with the resin layer 140 at the side face of the first insulating layer 150, the adhesion between the first insulating layer 150 and the resin layer 140 is enhanced.

The first insulating layer 150 has first openings 155a, 155b, and 155c. The first openings 155a, 155b, and 155c are arranged in regions corresponding to the first electrodes 40a, 40b, and 40c, respectively. Incidentally, when there is no need to distinguish the first openings 155a, 155b, and 155c from one another, the first openings 155a, 155b, and 155c are referred to as the first openings 155.

The first openings 155a, 155b, and 155c have the first conductive layers 160a, 160b, and 160c and second conductive layers 180a, 180b, and 180c, respectively, on the inside thereof.

The first conductive layers 160a, 160b, and 160c are electrically connected to the first electrodes 40a, 40b, and 40c, respectively. The second conductive layers 180a, 180b, and 180c are arranged directly on the first conductive layers 160a, 160b, and 160c to be in contact with the first conductive layers 160a, 160b, and 160c, respectively. The first conductive layers 160a, 160b, and 160c are, for example, titanium, copper, nickel, or a stacked layer thereof. The second conductive layers 180a, 180b, and 180c are copper or nickel, for example. Incidentally, when there is no need to distinguish the first conductive layers 160a, 160b, and 160c from one another and the second conductive layers 180a, 180b, and 180c from one another, the first conductive layers 160a, 160b, and 160c are referred to as the first conductive layers 160, and the second conductive layers 180a, 180b, and 180c are referred to as the second conductive layers 180.

Moreover, the first conductive layers 160 and the second conductive layers 180 are each arranged in an arbitrary pattern on a part of the first insulating layer 150. As a result, solder bumps 200, which will be described later, may be arranged in arbitrary positions on the resin layer 140 corresponding to the semiconductor device 5.

In other words, the first conductive layers 160 each have a first portion S1 which extends in a first direction intersecting the second face 20b (vertical direction in FIG. 1) and connects to the first electrode pad 40 and a second portion S2 which is arranged to extend in a second direction intersecting the first direction (horizontal direction in FIG. 1).

A second insulating layer 175 is arranged on the first insulating layer 150 and the second conductive layers 180. The second insulating layer 175 is, for example, a polyimide. The second insulating layer 175 includes a plurality of second openings 177a, 177b, and 177c. The second openings 177a, 177b, and 177c are arranged in regions corresponding to the second conductive layers 180a, 180b, and 180c, respectively. Incidentally, when there is no need to distinguish the second openings 177a, 177b, and 177c from one another, the second openings 177a, 177b, and 177c are referred to as the second openings 177.

The second openings 177a, 177b, and 177c have third conductive layers 190a, 190b, and 190c, respectively, therein.

The third conductive layers 190a, 190b, and 190c are electrically connected to the second conductive layers 180a, 180b, and 180c, respectively. The third conductive layers 190a, 190b, and 190c are, for example, titanium. Incidentally, when there is no need to distinguish the third conductive layers 190a, 190b, and 190c from one another, the third conductive layers 190a, 190b, and 190c are referred to as the third conductive layers 190.

Moreover, in other words, each third conductive layer 190 is arranged directly on at least a part of a corresponding second conductive layer 180.

The solder bumps (external terminals) 200a, 200b, and 200c are arranged on the third conductive layers 190a, 190b, and 190c, respectively. As described earlier, as a result of the first conductive layers 160 and the second conductive layers 180 being arranged in arbitrary patterns, there is flexibility in positioning the solder bumps 200. Specifically, for example, the solder bumps 200 may be arranged so that a second interval W2 between the centers of the adjacent solder bumps 200 is wider than a first interval W1 between the first electrodes 40 to which the solder bumps 200 are electrically connected. That is, sufficient space may be provided in the placement of the solder bumps 200. Moreover, for example, the solder bumps 200 may be arranged in accordance with an external substrate on which the semiconductor device 5 is mounted. Incidentally, when there is no need to distinguish the solder bumps 200a, 200b, and 200c from one another, the solder bumps 200a, 200b, and 200c are referred to as the solder bumps 200.

Furthermore, the solder bump 200b is electrically connected to the first semiconductor chip 20 via the first electrode 40b. The solder bump 200c is electrically connected to the second semiconductor chip 70 and the third semiconductor chip 100 via the first electrode 40c.

Production Method According to the First Embodiment

Figure 3:
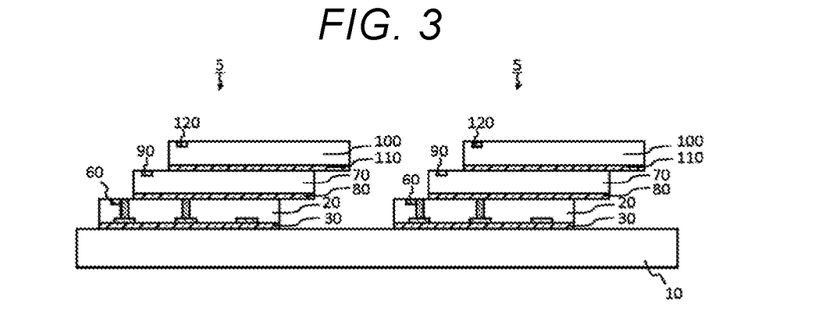
Figure 4:
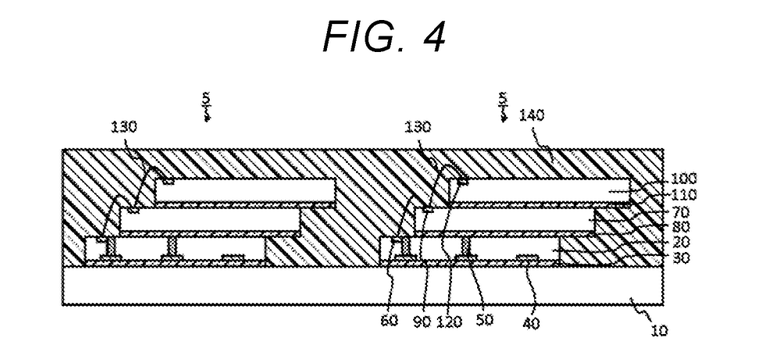

With reference to FIGS. 2 to 15, a production method of the semiconductor device 5 according to the first embodiment will be described. Incidentally, FIGS. 2 to 4 depict a state obtained by turning the structure in FIG. 1 upside down.

Figure 2:
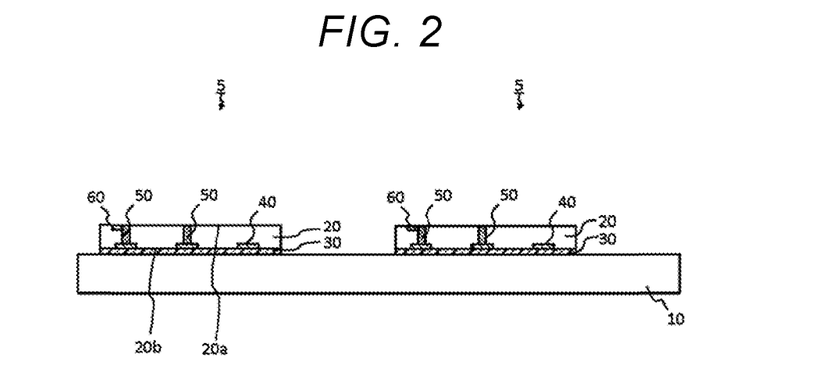
FIGS. 2-15 each illustrate a step in the method of manufacturing the semiconductor device according to the first embodiment.

As depicted in FIG. 2, the first semiconductor chip 20 is provided on a support substrate 10. First, a first adhesive material layer 30 is provided on the second face 20b. Then, the first adhesive material layer 30 is bonded to the support substrate 10, whereby the first semiconductor chip 20 is fixed to the support substrate 10.

The material of the support substrate 10 is silicon, for example, but any material may be used as long as the support substrate 10 may be stripped off later.

The first adhesive material layer 30 is, for example, a die attach film (DAF).

As described earlier, the first semiconductor chip 20 includes the first electrodes 40, the first conductive contacts 50, and the first electrode pad 60.

As depicted in FIG. 3, the second semiconductor chip 70 and the third semiconductor chip 100 are provided on the first semiconductor chip 20. The second adhesive material layer 80 is provided on a lower face of the second semiconductor chip 70. The second semiconductor chip 70 is fixed to the first semiconductor chip 20 with the second adhesive material layer 80.

In a similar manner, the third adhesive material layer 110 is provided on a lower face of the third semiconductor chip 100. The third semiconductor chip 100 is fixed to the second semiconductor chip 70 with the third adhesive material layer 110.

The second semiconductor chip 70 includes the second electrode pad 90, and the third semiconductor chip 100 includes the third electrode pad 120.

As depicted in FIG. 4, the metal wire 130 is provided to electrically connect the first electrode pad 60, the second electrode pad 90, and the third electrode pad 120.

As depicted in FIG. 4, the resin layer 140 is formed. The resin layer 140 is formed by, for example, putting the semiconductor device 5 in a mold, pouring a resin into the mold, and then curing the resin. Incidentally, the resin layer 140 may be formed by putting the support substrate 10 into a mold containing a resin and then curing the resin. That is, the resin layer 140 may be formed by various formation methods.

Figure 5:
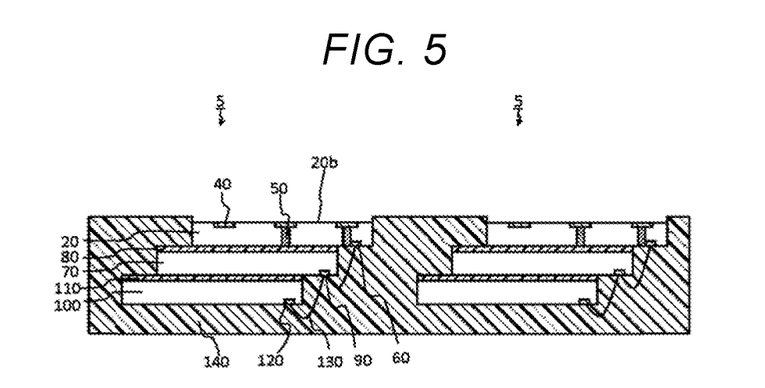

As depicted in FIG. 5, the semiconductor device 5 is turned upside down and the support substrate 10 and the first adhesive material layer 30 are stripped off. The support substrate 10 is removed by dry etching or etching using a chemical solution, for example. In addition, the first adhesive material layer 30 is removed by dry etching or etching using a chemical solution in a similar manner. Incidentally, between an upper face of the resin layer 140 the second face 20b, a step is generated as depicted in FIG. 5. This step enhances the adhesion with a film of the first insulating layer 150, which will be described later, and makes separation from the film less likely to happen.

Figure 6:
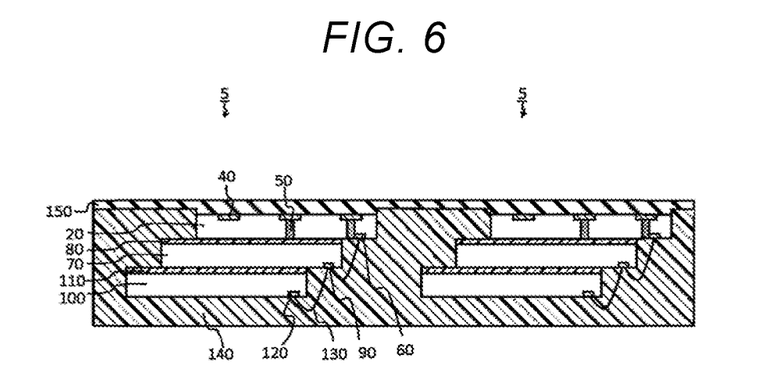

As depicted in FIG. 6, the first insulating layer 150 is formed. The first insulating layer 150 is, for example, a polyimide and is formed by coating and heat treatment. The first insulating layer 150 may also be a silicon oxide layer or a silicon nitride layer or may be formed by chemical vapor deposition (CVD).

As depicted in FIG. 6, the first insulating layer 150 is formed on the entire surface. That is, when viewed from above, the first insulating layer 150 overlaps the resin layer 140.

Figure 7:
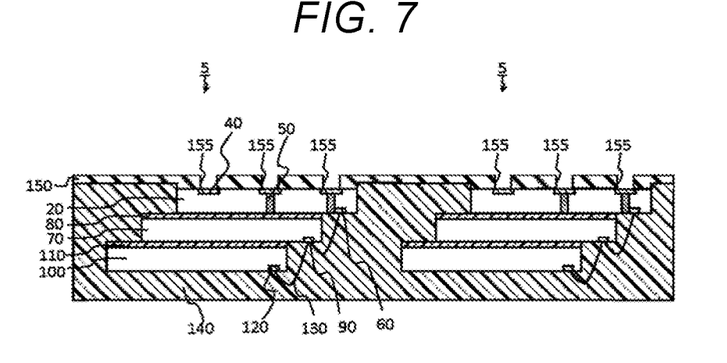

As depicted in FIG. 7, parts of the first insulating layer 150 directly on the first electrodes 40 are selectively removed, whereby the first openings 155 are formed.

For example, a mask pattern is formed on the first insulating layer 150 by lithography. The first insulating layer 150 is selectively removed by etching in accordance with the mask pattern. Here, a region which is selectively removed is a region corresponding to each of the first electrodes 40 of the first semiconductor chip 20.

Figure 8:
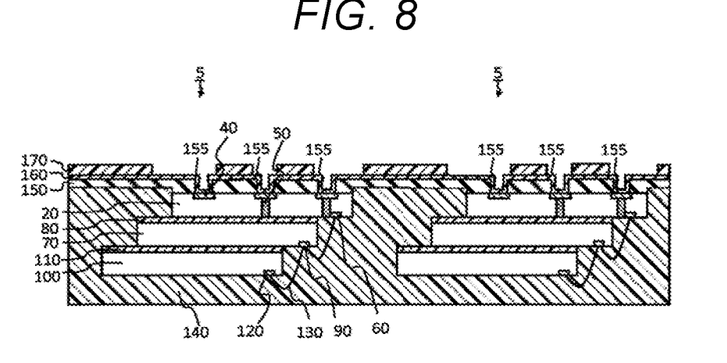

As depicted in FIG. 8, the first conductive layer 160 is formed on the first insulating layer 150 and on parts directly on the first electrodes 40 via the first openings 155. The first conductive layer 160 is, for example, titanium, copper, nickel, or a stacked layer thereof. Specifically, the first conductive layer 160 is a conductive material, such as a stacked layer of titanium and copper or a stacked layer of titanium and nickel, for example, and is formed by sputtering or by CVD.

Furthermore, as depicted in FIG. 8, a first mask pattern 170 is formed on the first conductive layer 160. The first mask pattern 170 is a resist, for example. The first mask pattern 170 is formed by lithography, for example.

Figure 9:
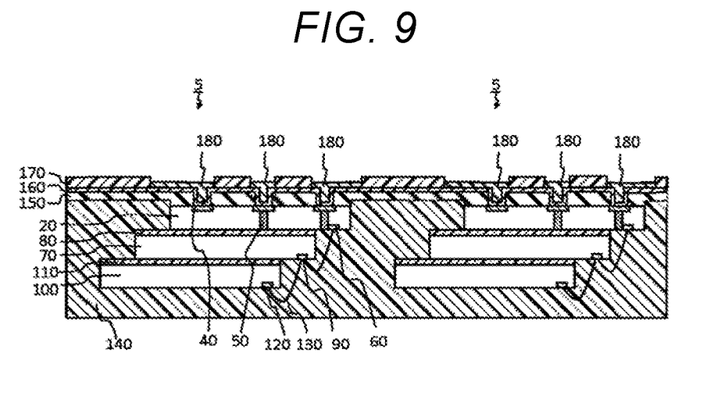

As depicted in FIG. 9, the second conductive layer 180 is provided on the first conductive layer 160 in areas in which the first mask pattern 170 is not provided. The second conductive layer 180 is formed by, for example, a metal plating method that uses the first mask pattern 170 as a mask and the first conductive layer 160 as a seed layer. The second conductive layer 180 is a conductive material, for example, copper or nickel. Alternatively, the second conductive layer 180 may be formed by forming a layer of a conductive material by sputtering or CVD and then performing patterning by lithography and removal by etching.

Figure 10:
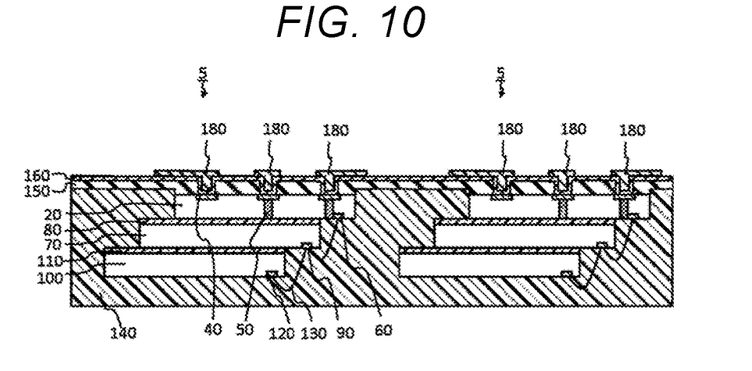

As depicted in FIG. 10, the first mask pattern 170 is removed. The removal is performed by ashing, for example.

Figure 11:
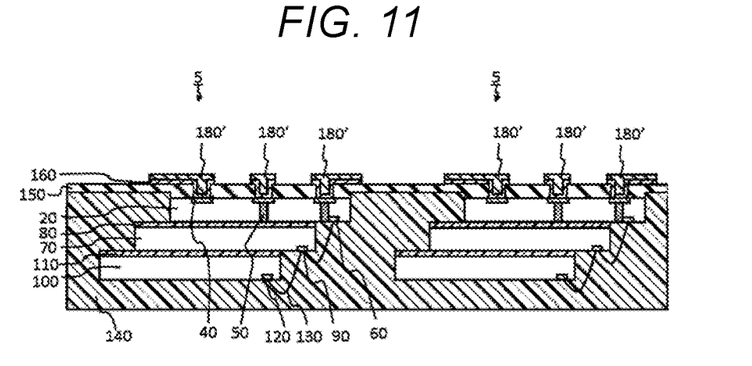

As depicted in FIG. 11, parts of the first conductive layer 160 are removed. Parts of the first conductive layer 160 are removed by performing etching using the second conductive layer 180 as a mask. Moreover, by this etching, parts of the front surface of the second conductive layer 180 are removed and become second conductive layers 180'.

Figure 12:
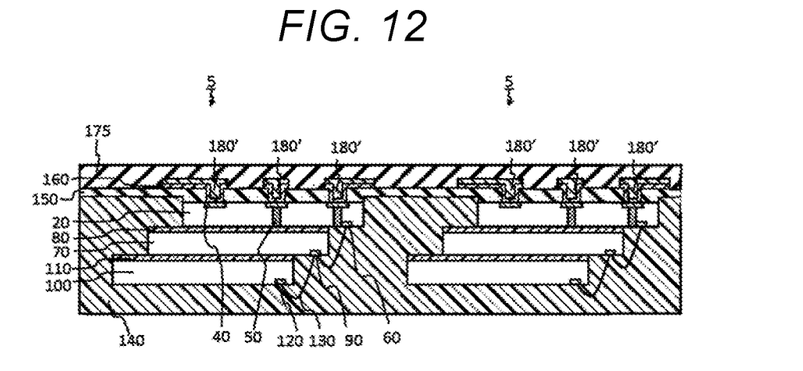

As depicted in FIG. 12, the second insulating layer 175 is formed on the first insulating layer 150 and the second conductive layers 180'. The second insulating layer 175 is, for example, a polyimide and is formed by coating and heat treatment. The second insulating layer 175 may be a silicon oxide layer or a silicon nitride layer or may be formed by the CVD.

Figure 13:
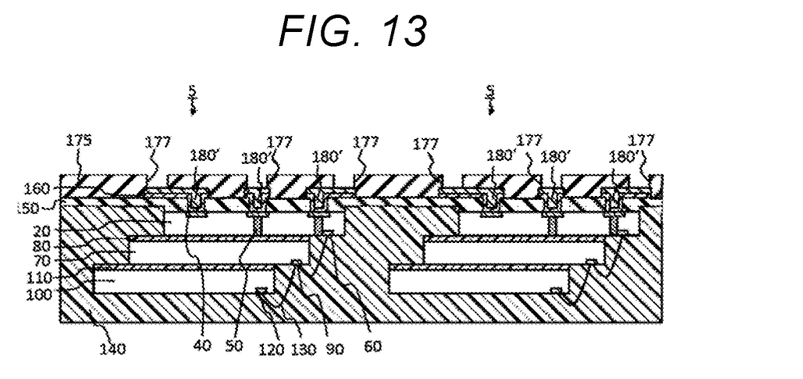

As depicted in FIG. 13, the second insulating layer 175 directly above the second conductive layers 180' is selectively removed.

For example, a mask pattern is formed on the second insulating layer 175 by lithography. The second insulating layer 175 is selectively removed by etching in accordance with the mask pattern, whereby the second openings 177 are formed.

Figure 14:
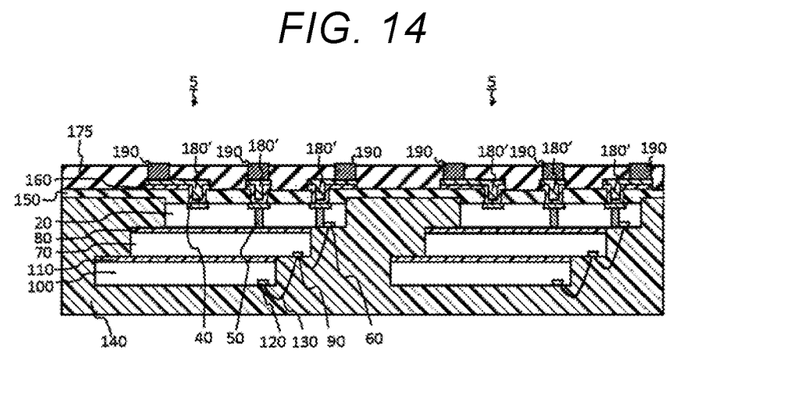

As depicted in FIG. 14, the third conductive layers 190 are formed inside the second openings 177. In other words, the third conductive layers 190 are formed on the second conductive layers 180' in the regions from which the second insulating layer 175 has been removed in FIG. 13. The third conductive layers 190 are each a conductive material, for example, titanium. The third conductive layers 190 are formed by a metal plating method that uses the second conductive layers 180' as seed layers. Moreover, the third conductive layers 190 may be formed by forming a layer of a conductive material on the second insulating layer 175 and the second conductive layers 180' by sputtering or CVD and then performing patterning by lithography and removal by etching.

Figure 15:
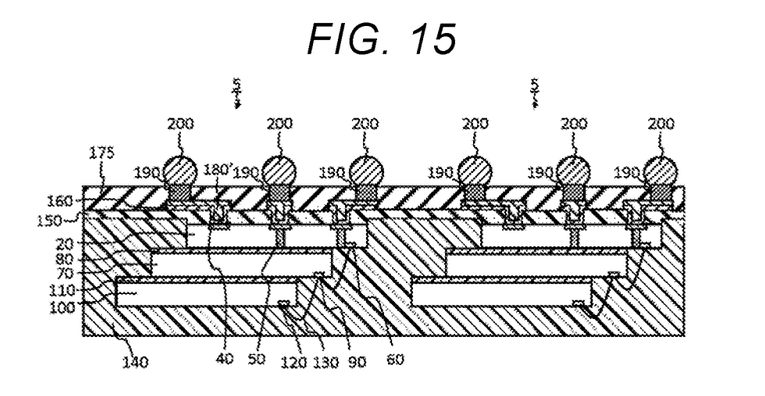

As depicted in FIG. 15, the solder bumps 200 are formed on the third conductive layers 190. The solder bumps 200 are formed by, for example, applying a solder paste and then performing reflowing. The solder paste may contain tin and silver or contain tin and copper, for example.

As depicted in FIG. 1, by obtaining separated semiconductor devices 5 by dicing, each semiconductor device 5 is formed. As depicted in FIG. 1, the first insulating layer 150 and the second insulating layer 175 overlap the resin layer 140 when viewed from above, and the resin layer 140, the first insulating layer 150, and the second insulating layer 175 are exposed to the outside at the sides as a result of dicing.

Effects of the First Embodiment

According to this embodiment, the second semiconductor chip 70 and the third semiconductor chip 100 are electrically connected to the solder bumps 200 via the first conductive contacts 50 and the first electrodes 40 provided in the first semiconductor chip 20. That is, according to this embodiment, the second semiconductor chip 70 and the third semiconductor chip 100 are electrically connected to the first conductive contacts 50 and are electrically connected to the solder bumps 200 via the first conductive contacts 50. Specifically, as depicted in FIG. 1, the second semiconductor chip 70 and the third semiconductor chip 100 are electrically connected to the solder bumps 200c. In some embodiments, the first conductive contacts 50 may be electrically connected to the circuit element of the first semiconductor chip 20, and the second semiconductor chip 70 and the third semiconductor chip 100 electrically connected to the circuit element of the first semiconductor chip 20.

Moreover, the circuit element such as a transistor, the wiring, the contact, and the electrode which are arranged near the first face 20a of the first semiconductor chip 20 are also connected to the solder bumps 200 via the first conductive contacts 50 and the first electrodes 40. Specifically, as depicted in FIG. 1, the circuit element such as a transistor, the wiring, the contact, and the electrode which are arranged near the first face 20a of the first semiconductor chip 20 are electrically connected to the solder bumps 200b via the first conductive contact 50b.

That is, according to this embodiment, the first semiconductor chip 20, the second semiconductor chip 70, and the third semiconductor chip 100 may be electrically connected to the solder bumps 200 without another wiring substrate with an electrode pad, and a metal wire for the wiring substrate. More specifically, electrical connection to the solder bumps 200 is achieved without, for example, an insulating resin wiring substrate, a ceramic wiring substrate, a printed wiring board using a glass epoxy resin, a silicon interposer, or a lead frame.

Moreover, the metal wire 130 only has to electrically connect the semiconductor chips, and therefore use of the metal wire 130 may be reduced.

That is, according to this embodiment, the area of a region in which the electrode pads are arranged may be reduced and the semiconductor device 5 may be made smaller. Furthermore, by eliminating the need of an extra wiring substrate and reducing the use of the metal wire 130, material may be saved and an inexpensive and environment-friendly semiconductor device 5 may be obtained.

According to this embodiment, on the first semiconductor chip 20, the first insulating layer 150 provided with the first openings 155 corresponding to the first electrodes 40 is provided. Then, the first conductive layers 160 and the second conductive layers 180 are arranged on the first openings 155 and the first insulating layer 150 in arbitrary patterns. In addition, as a result of the first conductive layers 160 and the second conductive layers 180 being arranged in arbitrary patterns, the solder bumps 200 may be arranged in arbitrary positions. For example, the solder bumps 200 may be provided so that the second interval W2 between the centers of the adjacent solder bumps 200 is wider than the first interval W1 between the first electrodes 40 to which the solder bumps 200 electrically connect and is a distance that allows physical connection to an external terminal to be established. Alternatively, for example, the solder bumps 200 may be arranged in accordance with an external substrate on which the semiconductor device 5 is mounted.

According to this embodiment, between the first semiconductor chip 20 and the solder bumps 200, the first insulating layer 150, the second insulating layer 175, the first conductive layers 160, the second conductive layers 180, and the third conductive layers 190 are provided. That is, since the wiring substrate as described above is not provided, the distance between the first semiconductor chip 20 and the solder bumps 200 may be made smaller and further miniaturization of the semiconductor device 5 is achieved.

According to this embodiment, the resin layer 140, the first insulating layer 150, and the second insulating layer 175 are provided so that the resin layer 140, the first insulating layer 150, and the second insulating layer 175 overlap one another when viewed from above. Moreover, at the sections formed by dicing, the resin layer 140, the first insulating layer 150, and the second insulating layer 175 are exposed to the outside. That is, the semiconductor device 5 may be formed to have a size that is independent of a size of a wiring substrate or the like.

First Modified Example of the First Embodiment

The stripping of the support substrate 10 depicted in FIG. 5 may be performed in the following manner.

As the first adhesive material layer 30, a thermoplastic resin is used. Then, in place of etching described in FIG. 5, heat treatment as a result of which the first adhesive material layer 30 goes into a plastic phase is performed. When the first adhesive material layer 30 is goes into the plastic phase, stripping off the support substrate 10 becomes possible.

Alternatively, a UV curable resin is formed on the support substrate 10. Then, in place of etching described in FIG. 5, UV irradiation is performed from the side where the support substrate 10 is located. As a result, the adhesion between the support substrate 10 and the first adhesive material layer 30 is reduced, and stripping of the support substrate 10 becomes possible.

Second Modified Example of the First Embodiment

In FIG. 1, a case in which the first semiconductor chip 20, the second semiconductor chip 70, and the third semiconductor chip 100 are present is described. However, the number of semiconductor chips is not limited to three and any number of semiconductor chips may be used.

Third Modified Example of the First Embodiment

Figure 16:
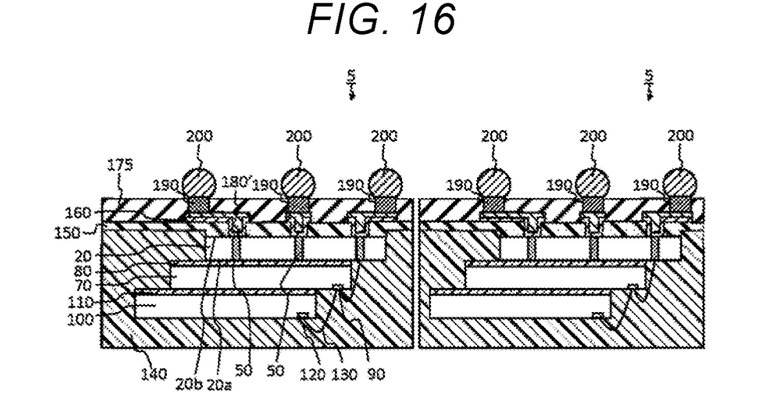
FIG. 16 is a cross sectional view of a modified example of the semiconductor device according to the first embodiment.

As depicted in FIG. 16, the first semiconductor chip 20 may not include the first electrodes 40 and the first electrode pad 60. In this case, the first conductive contacts 50 make up the electrodes on the first face 20a and the second face 20b and are electrically connected to the metal wire 130 and the first conductive layers 160.

Fourth Modified Example of the First Embodiment

In FIG. 1, an example in which the first semiconductor chip 20 is connected to the solder bumps 200 via the first conductive layers 160, the second conductive layers 180, and the third conductive layers 190 is described, but the example is not limited thereto. For example, the semiconductor device 5 may not be provided with the third conductive layers 190 and may be provided with the solder bumps 200 directly on the second conductive layers 180. Moreover, the semiconductor device 5 may not be provided with the second conductive layers 180 and the third conductive layers 190 and may be provided with the solder bumps 200 directly on the first conductive layers 160. Furthermore, the semiconductor device 5 may be provided with new conductive layers on the third conductive layers 190 and provided with the solder bumps 200 directly on the new conductive layers.

Fifth Modified Example of the First Embodiment

In FIG. 1, a case in which the first semiconductor chip 20 includes the first electrodes 40a, 40b, and 40c and the first conductive contacts 50b and 50c is depicted, but the example is not limited thereto. The first semiconductor chip 20 may include some of the first electrodes 40a, 40b, and 40c and the first conductive contacts 50b and 50c and may include additional first electrodes 40 and additional first conductive contacts 50.

Moreover, the first electrode 40c is electrically connected to the second semiconductor chip 70 and the third semiconductor chip 100, but the first electrode 40c may be electrically connected to only one of the second semiconductor chip 70 and the third semiconductor chip 100.

Sixth Modified Example of the First Embodiment

Figure 17:
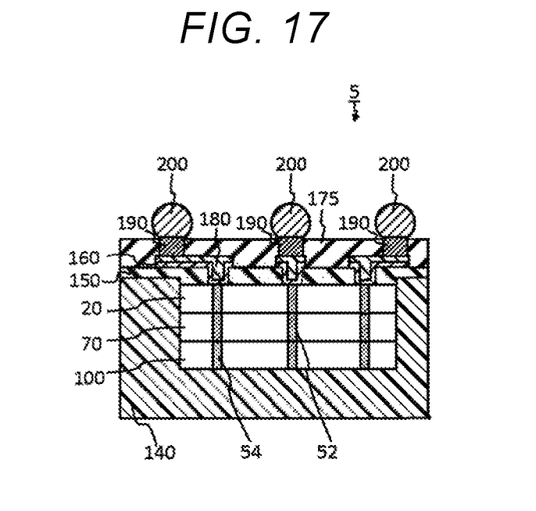
FIG. 17 is a cross sectional view of another modified example of the semiconductor device according to the first embodiment.

As depicted in FIG. 17, the second semiconductor chip 70 and the third semiconductor chip 100 may not include the second electrode pad 90 and the third electrode pad 120. In this case, as is the case with the first semiconductor chip 20, the second semiconductor chip 70 and the third semiconductor chip 100 include second conductive contacts 52 and third conductive contacts 54, respectively. In addition, the second semiconductor chip 70 and the third semiconductor chip 100 are connected to the first semiconductor chip 20 via the second conductive contacts 52 and the third conductive contacts 54, respectively. In this case, there is no need to stack the first semiconductor chip 20, the second semiconductor chip 70, and the third semiconductor chip 100 in a stair-shaped pattern, and thus further miniaturization of the semiconductor device 5 is achieved.

Incidentally, the structures of the second conductive contacts 52 and the third conductive contacts 54 may be the same as the structure of the first conductive contacts 50. In such a case, the second semiconductor chip 70 includes second electrodes on the fourth face 70b and the third semiconductor chip 100 includes third electrodes on the sixth face 100b. Then, the second conductive conducts 52 are electrically connected to the circuit element formed on the third face 70a and the second electrodes, and the third conductive conducts 54 are electrically connected to the circuit element formed on the fifth face 100a and the third electrodes.

Incidentally, an operation method of each semiconductor chip of the modified examples is described in U.S. patent application Ser. No. 13/843,165 ("SEMICONDUCTOR DEVICE") filed on Mar. 15, 2013, the entire contents of which are incorporated herein by reference.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first semiconductor chip having a first surface, a second surface on a side of the first semiconductor chip opposite to that of the first surface, a first electrode on the first surface, a second electrode on the second surface, and a first contact electrically connecting the first electrode and the second electrode;
   a second semiconductor chip having a third surface that faces the first surface, a fourth surface on a side of the second semiconductor chip opposite to that of the third surface, and a third electrode on the fourth surface;
   a metal wire that electrically connects the third electrode to the first electrode;
   a first insulating layer that is on the second surface of the first semiconductor chip and includes a first opening;
   a first conductive layer that is in the first opening and on a part of the first insulating layer and is electrically connected to the second electrode;
   a second conductive layer that is directly in contact with the first conductive layer;
   a second insulating layer that is on the first insulating layer and the second conductive layer and includes a second opening;

a third conductive layer that is in the second opening and is electrically connected to the second conductive layer; and
a first external terminal in direct contact with the third conductive layer, wherein
no wiring substrate is present between the first semiconductor chip and the first external terminal.

2. The semiconductor device according to claim 1, further comprising:
a fourth conductive layer that is in a third opening included in the first insulating layer and on a part of a fourth electrode, which is on the second surface, and is electrically connected to the fourth electrode; and
a second external terminal that is electrically connected to the fourth conductive layer.

3. The semiconductor device according to claim 2, further comprising:
a fifth conductive layer that is directly in contact with the fourth conductive layer;
a sixth conductive layer that is in a fourth opening included in the second insulating layer and is electrically connected to the fifth conductive layer, wherein
the second external terminal is directly in contact with the sixth conductive layer.

4. The semiconductor device according to claim 3, wherein
a distance between the first external terminal and the second external terminal is greater than a distance between the second electrode and the fourth electrode.

5. The semiconductor device according to claim 1, wherein
the first surface includes a first circuit element that is electrically connected to the first electrode, and
the fourth surface includes a second circuit element that is electrically connected to the third electrode.

6. The semiconductor device according to claim 5, wherein
the second surface includes a fourth electrode, and
the first semiconductor chip includes a second contact electrically connecting the first circuit element and the fourth electrode.

7. The semiconductor device according to claim 1, wherein
the first semiconductor chip and the second semiconductor chip have substantially the same structure.

8. The semiconductor device according to claim 1, wherein
the first external terminal is a solder bump.

9. The semiconductor device according to claim 1, further comprising:
a resin layer that covers the first semiconductor chip and the second semiconductor chip, wherein
the resin layer is in contact with a lower surface and a side surface of the first insulating layer.

10. A semiconductor device comprising:
a first semiconductor chip that includes a first surface, a second surface on a side of the first semiconductor chip opposite to that of the first surface, a first electrode on the first surface, a second electrode on the second surface, and a first contact electrically connecting the first electrode and the second electrode;
a second semiconductor chip that includes a third surface that faces the first surface, a fourth surface on a side of the second semiconductor chip opposite to that of the third surface, and a third electrode on the fourth surface;

a metal wire that electrically connects the third electrode and the first electrode;
a first conductive layer that includes a first portion which extends in a first direction intersecting the second surface and is electrically connected to the second electrode and a second portion which extends in a second direction intersecting the first direction;
a second conductive layer that is directly in contact with the first conductive layer and is physically separated from the second electrode by the first conductive layer;
a third conductive layer that is directly in contact with the second conductive layer and is physically separated from the first conductive layer by the second conductive layer; and
a first external terminal that is directly in contact with the third conductive layer and physically separated from the second conductive layer by the third conductive layer, wherein
no wiring substrate is present between the first semiconductor chip and the first external terminal.

11. The semiconductor device according to claim 10, further comprising:
a fourth conductive layer that is on a part of a fourth electrode, which is on the second surface, and is electrically connected to the fourth electrode; and
a second external terminal that is electrically connected to the fourth conductive layer.

12. The semiconductor device according to claim 11, further comprising:
a fifth conductive layer that is directly in contact with the fourth conductive layer and is physically separated from the fourth electrode by the fourth conductive layer; and
a sixth conductive layer that is directly in contact with the fifth conductive layer and is physically separated from the fourth conductive layer by the fifth conductive layer, wherein
the second external terminal is directly in contact with the sixth conductive layer is physically separated from the fifth conductive layer by the sixth conductive layer.

13. The semiconductor device according to claim 12, wherein
a distance between the first external terminal and the second external terminal is greater than a distance between the second electrode and the fourth electrode.

14. The semiconductor device according to claim 10, wherein
the first surface includes a first circuit element that is electrically connected to the first electrode,
the fourth surface includes a second circuit element that is electrically connected to the third electrode.

15. The semiconductor device according to claim 14, wherein
the second surface includes a fourth electrode,
the first semiconductor chip includes a second contact that electrically connects the first circuit element and the fourth electrode.

16. The semiconductor device according to claim 10, wherein
the first semiconductor chip and the second semiconductor chip have substantially the same structure.

17. The semiconductor device according to claim 10, wherein
the first external terminal is a solder bump.

18. The semiconductor device according to claim 10, further comprising:

a resin layer that covers the first semiconductor chip and the second semiconductor chip, wherein the resin layer is in contact with a lower surface and a side surface of the first insulating layer.

19. The semiconductor device according to claim 1, further comprising:

a third semiconductor chip, wherein the first, second and third semiconductor chips are electrically connected to the first external terminal.

20. The semiconductor device according to claim 10, further comprising:

a third semiconductor chip, wherein the first, second and third semiconductor chips are electrically connected to the first external terminal.

* * * * *